United States Patent [19]
Fu

[11] Patent Number: 6,052,311
[45] Date of Patent: Apr. 18, 2000

[54] ELECTRICALLY ERASABLE PROGRAMMABLE READ ONLY FLASH MEMORY

[75] Inventor: Kuan-Yu Fu, Hsinchu, Taiwan

[73] Assignee: United Microelectronics Corp., Hsinchu, Taiwan

[21] Appl. No.: 09/114,004

[22] Filed: Jul. 10, 1998

[30] Foreign Application Priority Data

May 27, 1998 [TW] Taiwan ................................. 87108222

[51] Int. Cl.[7] ..................................................... G11C 7/00
[52] U.S. Cl. .................................. 365/185.33; 365/185.1; 365/185.26
[58] Field of Search ......................... 365/185.33, 189.01, 365/230.01, 185.1, 185.25

[56] References Cited

U.S. PATENT DOCUMENTS 3,740,689  6/1973  Yamashita ........................... 365/185.33
3,974,055  8/1976  Arai .................................... 365/185.33

*Primary Examiner*—Terrell W. Fears
*Attorney, Agent, or Firm*—Thomas, Kayden, Horstemeyer & Risley

[57] ABSTRACT

An electrically erasable programmable read only flash memory having a buried floating gate structure buries the floating gate within the substrate. The source and drain regions are located beside the floating gate, and the control gate is located on the surface of the substrate and above the floating gate. In the program mode of read only flash memory based on the structure of this invention, the tunneling effect occurs between the floating gate and control gate to reduce leakage current and to raise the programming rate, which has the advantage of increasing the integration of memory cells.

11 Claims, 3 Drawing Sheets

|  |  | Control gate | Drain | Source | Base | Floating gate induced voltage | Operation |
|---|---|---|---|---|---|---|---|
| Program (or write) | Selected bit | 7.5V | -7.5V | Floating | -7.5V | -3.75V | Electrons tunneling to control gate from floating gate tunneling voltage about 11.25V |
|  | Unselected bit | 7.5V/0V | 0V/-7.5V | Floating | -7.5V | 0V/-5.6V | Gate and drain are not affected |
| Erase | Electrically erase entirely | -7V | 7V | 7V | 7V | 4.2V | Electrons tunneling to floating gate from control gate Tunneling voltage about 11.2V |
| Read | Selected bit | 5V | 1V | 0V | 0V | 1.2V | Threshold voltage between 05V to 0.8V |
|  | Unselected bit | 5V/0V | 0V/1V | 0V | 0V | 1V/0.2V | No current flows through memory cell, besides sub-threshold voltage leakage current |

TABLE 1

ELECTRICALLY ERASABLE PROGRAMMABLE READ ONLY FLASH MEMORY

CROSS-REFERENCE TO RELATED APPLICATION

This application claims the priority benefit of Taiwan application Ser. No. 87108222, filed May 27, 1998, the full disclosure of which is incorporated herein by reference.

BACKGROUND OF THE INVENTION

1. Field of the Invention

This invention relates in general to an electrically and programmable read only flash memory, and more specifically relates to an electrically programmable read only flash memory that has a buried gate structure.

2. Description of Related Art

Read only memory (ROM) is a kind of non-volatile memory, in which the stored memory or data are not erased when power is switched off. Alternately, data can be erased and rewritten on an erasable programmable ROM (EPROM), but erasing the EPROM requires irradiation by an ultra-violet ray, which raises the cost of the package. Besides, when the EPROM erases data, the program or data stored in the EPROM are completely erased so that each modification must be performed from the beginning. This takes a lot of time. An electrically erasable programmable read only memory (EEPROM), commonly used for modifying portions of data, does not have the above shortcomings, and because erasing and re-input are processed bit by bit, data can be written, read, and erased many times. Recently, an electrically erasable programmable read only memory with a shorter access time has been developed. Its access time is between 70–80 ns and is called "flash memory" by Intel corp., U.S. Flash memory is similar in structure to EEPROM, and furthermore the erasing process is performed block by block within about 1 or 2 seconds to shorten access time and to reduce manufacturing cost.

The flash memory cell usually includes a double layer gate structure. One layer is a polysilicon-floating gate to store charges, and the other layer is a control gate to control data access. The floating gate is on the bottom of the control gate, which usually floats without connection to other circuits, while the control gate usually connects to the word line. According to the channel hot electron effect, when data are stored into the cell, a voltage is applied to the drain and another voltage, higher than the drain voltage, is also applied to the control gate. This makes hot electron eject from the source, pass through the tunnel oxide near the drain, and inject into and be trapped in the floating gate. This raises the threshold voltage of the transistor and stores data into it. When the memorized data is electrically erased from the memory cell, a proper positive voltage is applied to the source to make the hot electrons trapped in the floating gate escape from the tunnel oxide, which erases data and restores the floating transistor to its pre-data storage state.

FIG. 1 shows a cross-sectional view of a conventional read only flash memory cell. The memory cell mainly comprises a floating transistor having a double-layer gate structure, the layers of which are the polysilicon floating gate 10 for charge storage and the control gate 12 for data access control. The floating transistor furthermore comprises a tunnel oxide 14, a gate oxide 16, a drain 18 and a source 20. The floating gate is located under the control gate, which usually floats without connection to other circuits, while the control gate is coupled to the word line.

The programming principle of the above-mentioned read only flash memory is the channel hot electron effect. When data are stored into the cells, a voltage is applied to the drain 18 on the substrate 22 and another voltage higher than the drain voltage is applied to the control gate 12. This makes hot electrons eject out of the source 20 and pass through the tunnel oxide 14 in the vicinity of the drain 18, then inject into and be trapped inside the floating gate 10. This action stores data into the cells and raises the threshold voltage of the floating transistor. When data are erased from the cells, a proper voltage is applied to the drain 18 to force electrons trapped inside the floating gate 10 to escape through the tunnel oxide 14 again. This erases the data and restores the floating transistor to its pre-data storage state.

Conventionally, there are two ways to shorten the operation time of programming and electrically erasing the read only flash memory as well as to enhance the tunnel electric field. One way is to enlarge the overlap area between the floating gate and the control gate, that is, to raise the capacitance coupling ratio of the read only flash memory. The other way is to raise the operation voltage. The method to increase the capacitance coupling ratio typically uses the space above the isolating region, including the field oxide (FOX) or the shallow trench isolation (STI), to increase the overlap area between the floating gate and the control gate. However, with the development of modern semiconductor technology trends towards high integration and high density of memory cells, it is desirable to have increasingly smaller memory cells. Therefore, the above method is contrary to future development. On the other hand, increasing the operation voltage of programming and electrically erasing is also contrary to modern tendencies. A lower operation voltage is desirable for modern semiconductor technology in order to avoid dissipation of heat and signal interference. Therefore, the method mentioned above will not work in future, either. Besides, to increase the operation voltage not only causes the band-to-band tunneling effect between the floating gate and the control gate but also consumes a large amount of electric power, which causes a reliability problem. In addition, increasing the operation voltage requires an additional high voltage pump circuit to amplify the input voltage, which further occupies more wafer area and slows operation time.

SUMMARY OF THE INVENTION

An object of this invention is to provide an electrically erasable programmable read only flash memory having a buried gate structure. In this structure, the floating gate is buried in a trench in the substrate to make the tunnel effect occur at the interface between the floating gate and the control gate when programming or electrically erasing. According to the structure of the read only flash memory of this invention, either the programming and electric erasing, speed or the integration of memory cells is increased. The invention also avoids high operation power consumption and the carrier degradation effect.

In accordance with the foregoing and other objectives, a structure of an electrically erasable programmable read only flash memory is provided. The flash memory cells are formed on the substrate, and each of the flash memory cells comprises a floating gate, a control gate, and two source/drain regions. The floating gate is buried within the substrate. The side walls and the bottom of the floating gate are surrounded by a first dielectric layer, and a second dielectric layer is deposited over the floating gate. The control gate is located on the surface of the second dielectric layer and above the floating gate. The two source/drain regions are located respectively beside the floating gate and within the substrate, which are adjacent to the floating gate through the first dielectric layer.

BRIEF DESCRIPTION OF THE DRAWINGS

While the specification concludes with the claims particularly pointing out and distinctly claiming the subject matter which is regarded as the invention, the objects and features of the invention and further objects, features and advantages thereof will be better understood from the following description made in connection with the accompanying drawings in which:

TABLE 1 lists operation modes according to the preferred embodiment of read only flash memory of this invention.

DESCRIPTION OF THE PREFERRED EMBODIMENT

Figure 1:
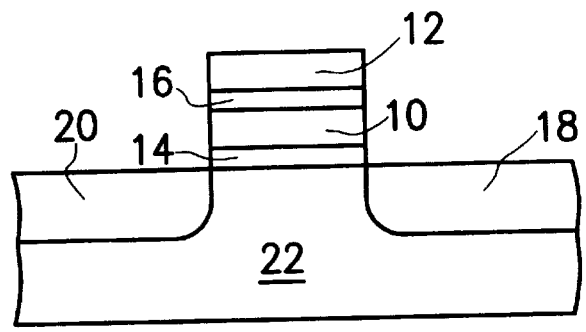
FIG. 1 is a cross-sectional view of a conventional read only flash memory cell.
Figure 2:
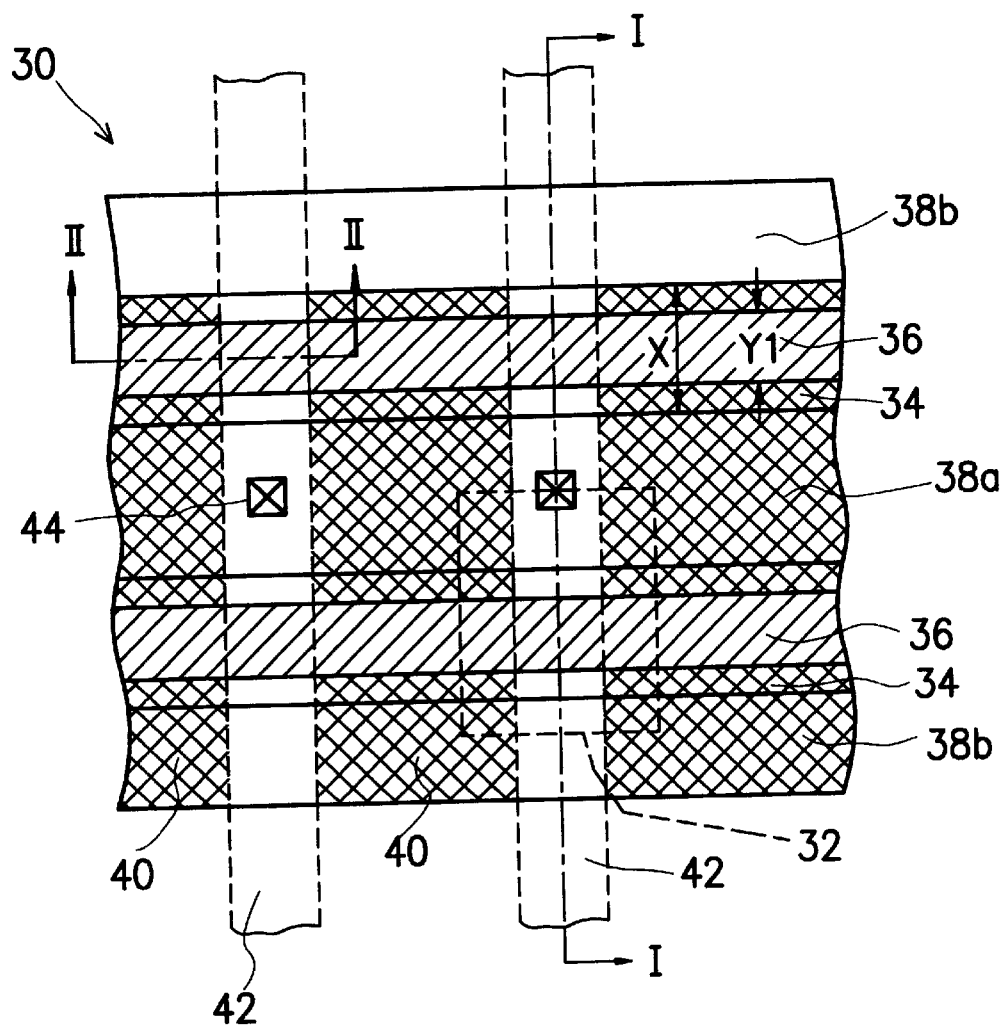
FIG. 2 is a top view of a preferred embodiment according to this invention.

FIG. 2 shows a top view of a preferred embodiment of an electrically erasable programmable read only flash memory according to the invention. An electrically erasable and programmable read only flash memory 30 consists of a plurality of read only flash memory cells 32. Each of those cells 32 at least comprises a floating gate 34, a control gate 36 (word line), and source/drain regions 38a, 38b. According to the layout of the embodiment of invention, the source/drain regions 38a serve as the drain of the cell while the source/drain regions 38b serve as the source. In addition, the read only flash memory 30 further comprises isolations 40 and bit lines 42 for connecting memory cell 32 and the drain 38a via contact 44.

Figure 3:
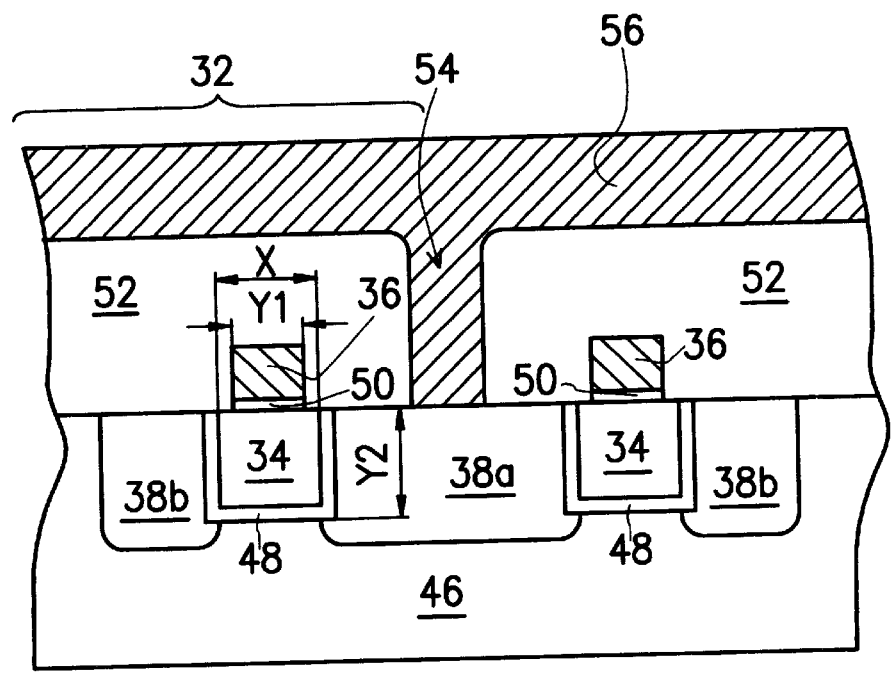
FIG. 3 is a cross-sectional view through section I—I of FIG. 2.
Figure 4:
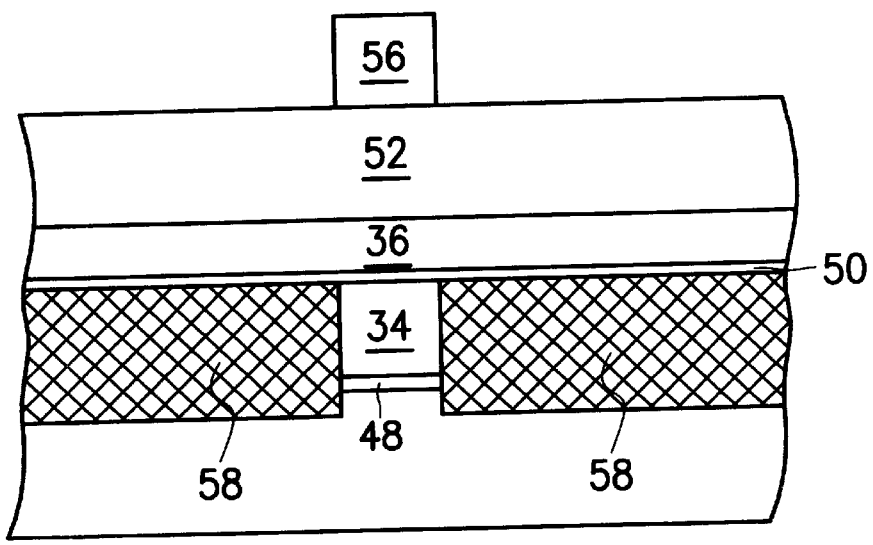
FIG. 4 is a cross-sectional view through section II—II of FIG. 2.

Next, referring to FIG. 3 and FIG. 4, FIG. 3 shows a cross-sectional view corresponding to line I—I in FIG. 2 and FIG. 4 shows a cross-sectional view corresponding to line II—II in FIG. 2. An electrically erasable programmable read only flash memory 30 is formed on the substrate 46, such as a P-substrate. The floating gate 34 of memory cell 32 is buried within the substrate 46, and is formed from a material such as doped silicon. The side walls and bottom of the floating gate are surrounded by a first dielectric layer 48 formed from a material such as silicon oxide. The source 38b and drain 38a of the memory cell 32 are located respectively beside the floating gate 34, by a process such as implanting N-type ions into the substrate 46 to form N doped regions, which are also adjacent to the floating gate 34 via the first dielectric layer 48. The control gate 36 is formed from a material such as doped polysilicon and is located on the surface of substrate 46 above the floating gate 34. A second dielectric layer is formed from a material such as silicon oxide and is located between the control gate 36 and the floating gate 34. In addition, an isolating layer 52 is deposited over the memory cell 32 and includes a contact opening 54 for coupling the bit line 56 and the drain 38a of the memory cell 32, in which the material of the bit line 56 can be doped polysilicon. There is also an isolating structure between memory cells. The isolation structure is a field oxide formed by wet thermal oxidation or a shallow trench isolation as in the embodiment.

The basic elements of the electrically erasable programmable read only flash memory are disclosed above, and the operation of this invention is described with reference to FIGS. 2, 3 and 4. It should be noticed that the difference in operation between this invention and conventional read only flash memory is that the conventional programming and electrically erasing methods both use the hot carrier tunneling effect between the floating gate and the drain while this invention uses the tunneling effect between the floating gate and the control gate. Therefore, in addition to the buried gate structure, the sizes of some elements of this invention are specially designed. In order to enhance the coupling ratio between the floating gate 34 and source 38b/drain 38a and make sure that the tunneling effect occurs between the floating gate 34 and the control gate 36, the width Y1 of the control gate 36 is smaller than the width X of the floating gate 34 and the preferred width ratio between the floating gate 34 and the control gate 36 is between about ½ to ⅓. Furthermore, in order to make the channel between the source 38b and the drain 38a, about under the bottom of the floating gate 34, have a preferred electrical property, the doped depth of the source 38b and the drain 38a cannot be very deep. That is, the buried depth of the floating gate 34 is not very deep. In design, the buried depth Y2 of the floating gate 34 is smaller than the width X of the floating gate, and a preferred ratio of the depth and width of the floating gate 34 is about ½ to ⅓.

In the following embodiment, the width Y1 of the control gate 36 is approximately equal to half the width X of the floating gate 34, while the buried depth Y2 of the floating gate 34 is approximately equal to half the width X of the floating gate 34. In an example of an N-type metal-oxide-semiconductor (MOS) device, X is about 0.5 $\mu$m, Y1 and Y2 are about 0.25 $\mu$m. Table 1 lists operation modes according to the preferred embodiment of read only flash memory of this invention.

The conventional program mode needs a higher operation voltage to induce hot carriers between drain and source so that only few high-energy hot carriers tunnel to the floating gate from the drain. Therefore, the conventional program mode also needs a higher operation voltage and most of the hot carriers produce leakage current that waste electric power. It is obvious from TABLE 1 that the structure of this invention can make the tunneling effect occur between the floating gate and the control gate, and not require a high operation voltage, which causes no hot carriers created between source and drain and no leakage current. In addition, in order to raise the programming rate or provide a variety of threshold voltages, an intelligent programming method is used; that is, an ascending step voltage pulse is used for programming. It is not necessary to enlarge the floating gate and the control gate according to the invention, so it is certain that the tunneling effect occurs between the floating gate and the control gate, which increases the integration of memory cells.

While the present invention has been described with a preferred embodiment, this description is not intended to limit the invention. Various modifications of the embodiment will be apparent to those skilled in the art. It is therefore contemplated that the appended claims will cover any such modifications or embodiments as fall within the true scope of the invention.

What claimed is:

1. An electrically erasable programmable read only flash memory, formed on a substrate, wherein and the electrically erasable programmable read only flash memory at least comprises a plurality of memory cells, and each of the memory cells comprises:

a floating gate buried within the substrate, with the side walls and the bottom of the floating gate surrounded by a first dielectric layer, and a second dielectric layer deposited over the floating gate;

a control gate located on the surface of the second dielectric layer; and two source/drain regions, locating beside the floating gate and within the substrate, respectively.

2. The electrically erasable programmable read only flash memory of claim 1, wherein the width of the control gate is smaller than that of the floating gate.

3. The electrically erasable programmable read only flash memory of claim 1, wherein the buried depth of the floating gate is smaller than the width of the floating gate.

4. The electrically erasable programmable read only flash memory of claim 1, wherein the width ratio of the floating gate and the control gate is about between ½ and ⅓.

5. The electrically erasable programmable read only flash memory of claim 1, wherein the ratio of the buried depth and the width of the floating gate is about between ½ and ⅓.

6. The electrically erasable programmable read only flash memory of claim 1, wherein the material of the floating gate comprises doped polysilicon.

7. The electrically erasable programmable read only flash memory of claim 1, wherein the material of the control gate comprises doped polysilicon.

8. The electrically erasable programmable read only flash memory of claim 1, wherein the material of the first dielectric layer comprises silicon oxide.

9. The electrically erasable programmable read only flash memory of claim 1, wherein the material of the second dielectric layer comprises silicon oxide.

10. The electrically erasable programmable read only flash memory of claim 1, wherein the source/drain regions are an N-doped region.

11. The electrically erasable programmable read only flash memory of claim 1, wherein the substrate is a P-substrate.

* * * * *